(12) United States Patent
Rinck

(10) Patent No.: US 9,805,157 B1
(45) Date of Patent: Oct. 31, 2017

(54) DECOUPLING CAPACITOR ANALYSIS TECHNIQUES

(71) Applicant: Xilinx, Inc., San Jose, CA (US)

(72) Inventor: John J. Rinck, San Jose, CA (US)

(73) Assignee: XILINX, INC., San Jose, CA (US)

( * ) Notice: Subject to any disclaimer, the term of this patent is extended or adjusted under 35 U.S.C. 154(b) by 185 days.

(21) Appl. No.: 14/660,710

(22) Filed: Mar. 17, 2015

(51) Int. Cl.
*G06F 17/50* (2006.01)

(52) U.S. Cl.
CPC ................... *G06F 17/5081* (2013.01)

(58) Field of Classification Search
CPC .................................................. G06F 17/5081
USPC .......................................................... 716/133
See application file for complete search history.

(56) References Cited

U.S. PATENT DOCUMENTS

| | | | |
|---|---|---|---|
| 7,802,220 B1 * | 9/2010 | Popovich | G06F 17/5036 716/120 |
| 8,146,049 B2 * | 3/2012 | Okano | G06F 17/5036 716/137 |

\* cited by examiner

*Primary Examiner* — Jack Chiang
*Assistant Examiner* — Brandon Bowers
(74) *Attorney, Agent, or Firm* — Keith Taboada; Robert M. Brush; Carleton Clauss

(57) ABSTRACT

A method, computer system, and computer-readable medium for determining a first decoupling constant for circuitry. The method includes determining a target impedance value and a first step current value for the circuitry. The method also includes iteratively simulating a model of the circuitry while adjusting a first number of first decoupling capacitors until impedance across a range of frequencies is below the target impedance value to obtain a first final number of first decoupling capacitors. The method further includes calculating a first decoupling constant based on the first step current value and the first final number of first decoupling capacitors.

20 Claims, 4 Drawing Sheets

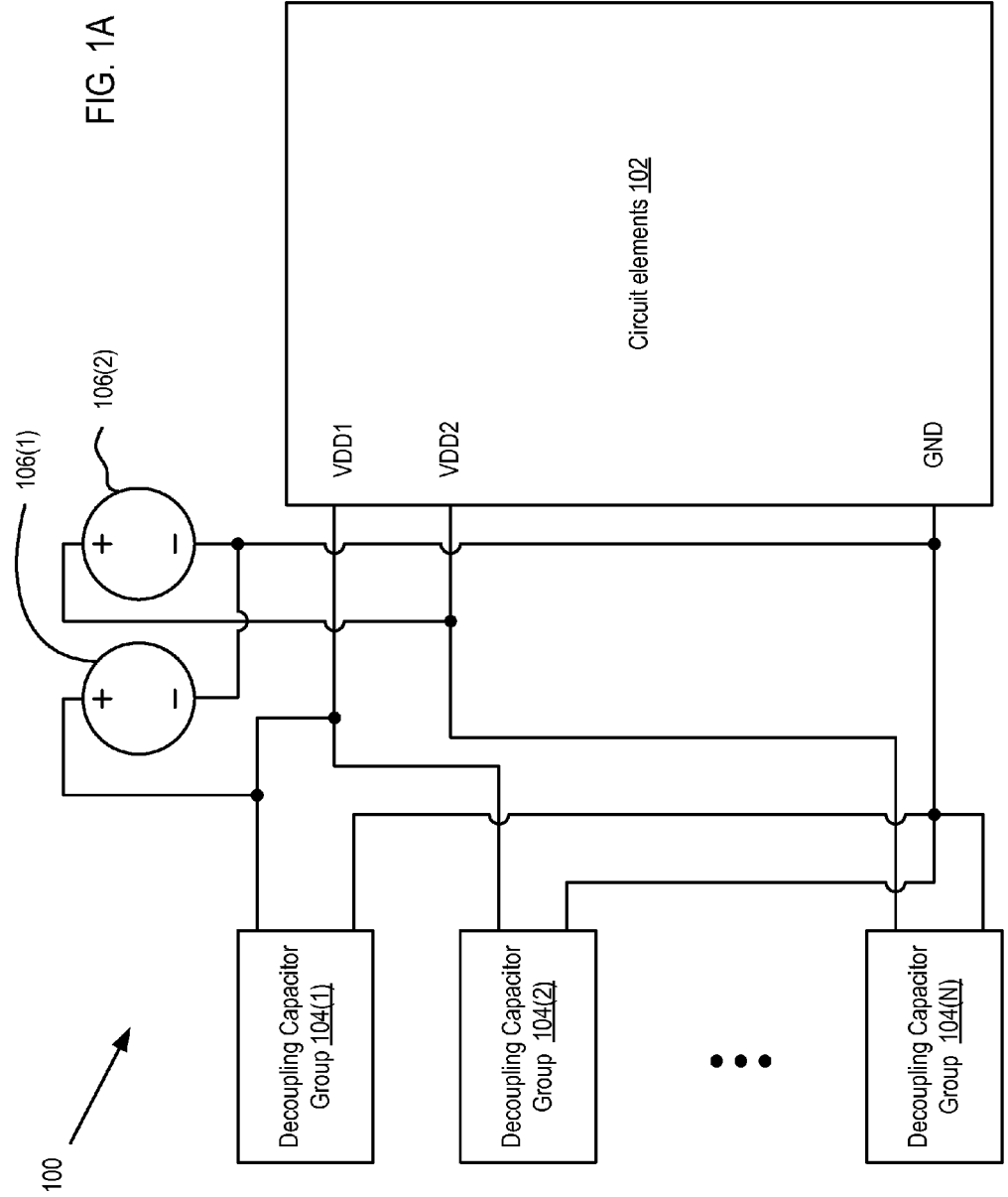

DECOUPLING CAPACITOR ANALYSIS TECHNIQUES

TECHNICAL FIELD

Examples of the present disclosure generally relate to coupling capacitors within integrated circuits and, in particular, to techniques for determining a number of decoupling capacitors, of various types, appropriate for a particular integrated circuit.

BACKGROUND

Integrated circuits (as well as other types of circuits) may include decoupling capacitors to provide a power buffer for the power supplies that provide power to the integrated circuits. These decoupling capacitors generally serve to compensate for an inability of power supplies to handle especially high-frequency changes in current requirements. Such changes may occur, for example, because the integrated circuit experiences high-frequency changes in power demands, due to, for example, a particular part of the integrated circuit rapidly varying between high and low utilization. In general, for some high-frequency power demand changes, associated power supplies are unable to properly follow such power demand changes. The decoupling capacitors thus provide a "buffer" of charge to compensate for this inability.

In general, circuit designers provide a number of decoupling capacitors of different values to serve this "buffering" function. Different anticipated frequencies of power demand changes call for different capacitor values. For example, one particular demand change frequency may be associated with a first particular capacitor value and another particular demand change frequency may be associated with a second particular capacitor value. In addition, different power supplies may have different associated demand change frequencies. To accommodate a wide range of demand change frequencies and power supply values, capacitors with various different capacitor values may be provided.

Part of designing circuitry is determining the number of the various capacitor values for the decoupling capacitors to be included. The process for determining these numbers, however, is generally tedious.

SUMMARY

A method for determining a first decoupling constant for circuitry is provided. The method includes determining a target impedance value and a first step current value for the circuitry. The method also includes iteratively simulating a model of the circuitry while adjusting a first number of first decoupling capacitors until impedance across a range of frequencies is below the target impedance value to obtain a first final number of first decoupling capacitors. The method further includes calculating a first decoupling constant based on the first step current value and the first final number of first decoupling capacitors.

A computer system for determining a first decoupling constant for circuitry is provided. The computer system includes a processor and a memory. The memory stores instructions that, when executed by the processor, cause the processor to perform a method. The method includes determining a target impedance value and a first step current value for the circuitry. The method also includes iteratively simulating a model of the circuitry while adjusting a first number of first decoupling capacitors until impedance across a range of frequencies is below the target impedance value to obtain a first final number of first decoupling capacitors. The method further includes calculating a first decoupling constant based on the first step current value and the first final number of first decoupling capacitors.

A non-transitory computer-readable medium storing instructions that, when executed by a processor, cause the processor to perform a method for determining a first decoupling constant for circuitry is also provided. The method includes determining a target impedance value and a first step current value for the circuitry. The method also includes iteratively simulating a model of the circuitry while adjusting a first number of first decoupling capacitors until impedance across a range of frequencies is below the target impedance value to obtain a first final number of first decoupling capacitors. The method further includes calculating a first decoupling constant based on the first step current value and the first final number of first decoupling capacitors.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

FIG. 1A is a block diagram of circuitry for analysis.

To facilitate understanding, identical reference numerals have been used, where possible, to designate identical elements that are common to the figures. It is contemplated that elements of one example may be beneficially incorporated in other examples.

DETAILED DESCRIPTION

Figure 1B:
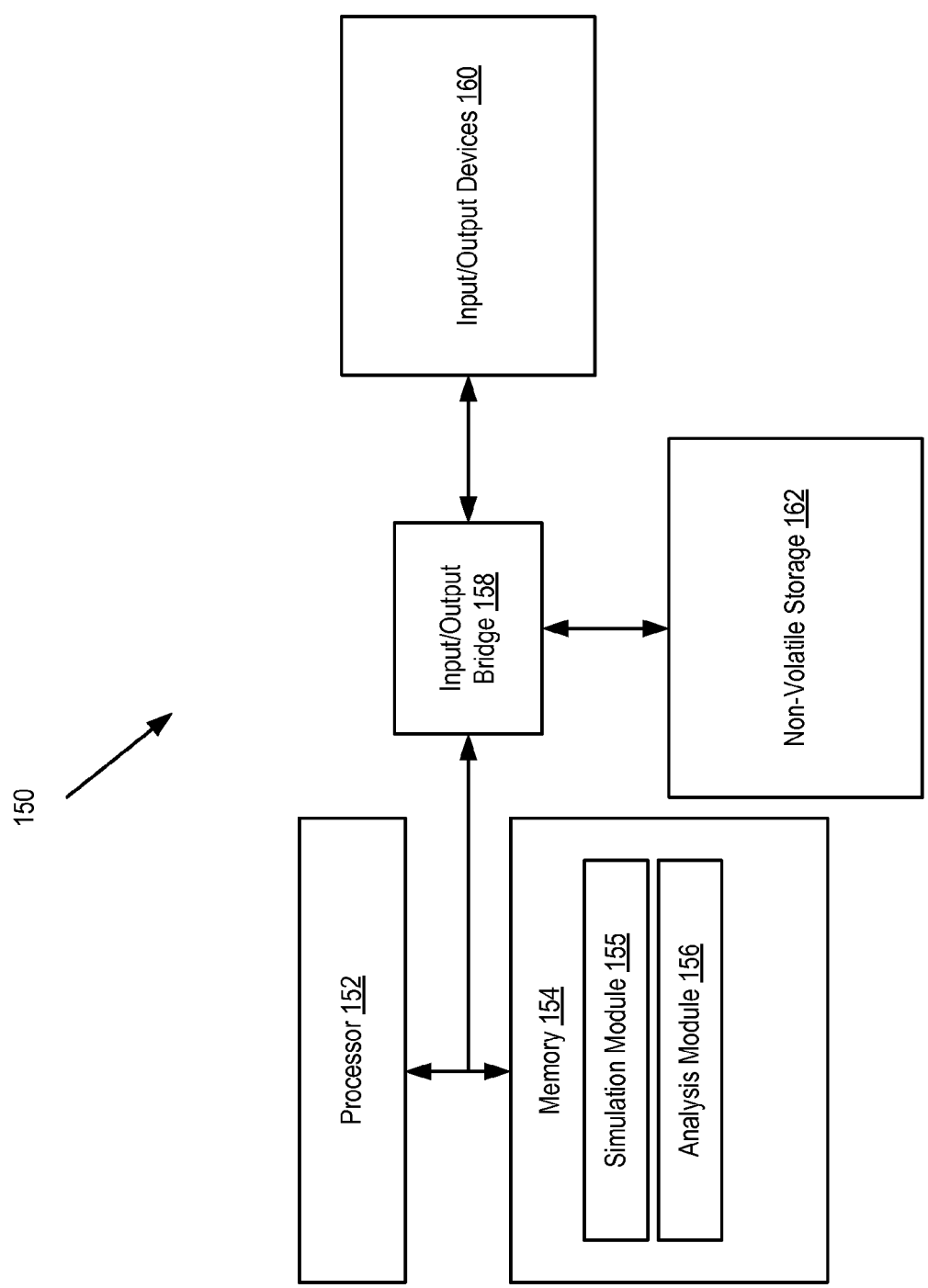
FIG. 1B is a block diagram that illustrates a computer system for performing techniques for determining the number of decoupling capacitors for use with particular circuitry.

Techniques for determining a number of decoupling capacitors for use in circuitry are provided. The techniques generally involve obtaining a model of the circuitry, where the model generally includes circuitry simulation elements that correspond to the elements of the circuitry. The model also includes an initial number of decoupling capacitors for which the simulation is performed. A simulation is performed to obtain impedance-versus-frequency data, where the frequency refers to the frequency with which current demands change (between a "high" or "full" current value and a "low" or "quiescent" current value) and where the impedance refers to the overall impedance of the circuitry.

Once the simulation is performed, the results of the simulation are examined to determine whether the impedance is below a threshold at substantially all frequencies of interest. If the impedance is not below the threshold at all frequencies of interest, then the decoupling capacitors are added to the model and the simulation is again performed. If the impedance is below the threshold at all frequencies of interest after decoupling capacitors are added, then no more decoupling capacitors are added. Once the analysis has determined a number of decoupling capacitors for which the impedance is below the threshold at all frequencies of interest, a decoupling coefficient is calculated. The decoupling coefficient is calculated based on the step current applied to the model in the simulation and the final number of decoupling capacitors, where the step current is the difference in current demand of the circuitry in the model between the "full" current value and the "quiescent" current value. Once the decoupling coefficient is determined, this decoupling coefficient may be used to calculate a number of decoupling capacitors for other step currents so that when the circuit analyzed is operated with different current requirements (and thus different step currents), an appropriate number of decoupling capacitors may be determined.

FIG. 1A is a block diagram of circuitry 100 for which appropriate numbers of decoupling capacitors are to be determined. As shown, the circuitry 100 includes circuit elements 102, decoupling capacitor groups 104, and power supplies 106. The circuit elements 102 may include elements of an integrated circuit, such as one or more integrated circuit chips, chip packaging, interconnects between the chips, and other elements. The power supplies 106 provide power to the circuit elements 102. Because the circuit elements 102 may use different power supply voltages, or for other reasons, multiple power supplies 106 are illustrated in FIG. 1A and may be coupled to provide power to the circuit elements 102. The voltage associated with each power supply 106 may be the same as, or different from, any of the other power supplies 106. Of course, in some examples, only one power supply 106 may be present. In FIG. 1A, a first power supply 106(1) is shown providing power to a first power input (VDD1) and a second power supply 106(2) is shown providing power to a second power input (VDD2), as an example.

The decoupling capacitor groups 104 include decoupling capacitors that are coupled to the circuit elements 102 in parallel with the power supplies 106 so that charge stored in the decoupling capacitor groups 104 may be provided to circuit elements 102 when power supplies 106 are unable to provide charge. In general, circuit elements 102 may oscillate between drawing a first, lower amount of current (a "quiescent current demand") and a second, higher amount of current (a "full current demand"). As described above, power supplies 106 generally have a limit on the speed with which they can respond to changes in current demand. The current deficit caused by this limit is compensated for by the decoupling capacitor groups 104, which store and release charge on demand.

Each decoupling capacitor group 104 includes one or more decoupling capacitors having the same capacitance value. Decoupling capacitors of different decoupling capacitor groups 104 may have different or the same capacitance values. For example, decoupling capacitors of the first decoupling capacitor group 104(1) may have a first capacitance value, a decoupling capacitors of the second decoupling capacitor group 104(2) may have a second capacitance value, and so on. The decoupling capacitors within a particular decoupling capacitor group 104 may be placed at disparate locations within circuitry 100 in order to service specific circuit elements 102. Further, the decoupling capacitors are generally coupled to a set of power/ground plates—one for the high voltage and another for the ground voltage.

As described above, the techniques presented herein are techniques for determining the number of decoupling capacitors (one or more) for any particular decoupling capacitor group 104 in order to sufficiently compensate for power supply 106 limitations. Thus, techniques for determining the number of capacitors for any particular capacitance value are now described with respect to FIG. 1B.

FIG. 1B is a block diagram that illustrates a computer system 150 for performing such techniques. Although described as performed in conjunction with the computer system 150 of FIG. 1B, those of skill in the art will understand that other systems, such as differently configured computing systems, analog computer systems, application specific integrated circuits (ASICs), or any other system or device may perform part or all of the described techniques.

As shown, the computer system 150 includes a processor 152, a memory 154, an input-output bridge 158, one or more input/output devices 160, and non-volatile storage 162. The processor 152 generally includes an electronic circuit configured to receive and execute instructions to perform specified functionality. The memory 154 is configured to store data and instructions to provide to processor 152 for processing. A simulation module 155 and an analysis module 156 are stored within memory 154. An input/output bridge 158 provides communication between processor 152, storage 162, and input/output devices 160. The storage 162 can include devices such as a hard drive for non-volatile storage of data and application programs. Input/output devices 160 include devices for human interaction with computer system 150 such as a monitor, keyboard, mouse, and the like.

The simulation module 155 is configured to simulate circuit models (for example, a model 157 of circuitry 100 of FIG. 1A) to determine electrical characteristics of such models. Electrical characteristics may include impedance versus frequency of power draw change. In other words, simulation module 155 is able to perform a "frequency-versus-impedance sweep" on a model of circuitry, where the frequency is the frequency with which the circuitry oscillates between drawing a "high" level of current and a "low" level of current, and the impedance is the input impedance of the circuitry.

The analysis module 156 is configured to determine an appropriate number of decoupling capacitors for each decoupling capacitor group 104. To determine the number of decoupling capacitors for a particular decoupling capacitor group 104, the analysis module 156 receives a model 157 of circuitry (such as circuitry 100) for analysis. In general, the model 157 includes model components that allow the simulation module 155 to calculate impedance for the circuitry 100 as a function of the frequency with which the current draw of the circuitry changes (this relationship is also referred to herein as a "impedance-frequency characteristics" of the circuitry). More specifically, the model 157 includes either discrete components (capacitors, resistors, inductors, and the like) or s-parameter model elements for any particular element of circuitry. An s-parameter model element is a model element that sets forth resistance, capacitance, and inductance values for different frequencies of operation of the circuit, where, as described above, the frequencies describe the rate at which the current demand changes for the circuit.

The model 157 provided may include discrete elements representing an RC approximation of the power supplies 106, discrete elements for the "rail package" (the electrical components that contain and convey the power supply and ground signals), discrete elements for various capacitors within the circuitry, and discrete elements or s-parameter elements for other package components such as package balls that couple different chips together. The model 157 also includes discrete or s-parameter elements that represent other functional elements of circuit elements 102, such as circuitry that performs logic functions, analog functions, or the like. The model 157 further includes model elements for the decoupling capacitor groups 104 so that the effect of the decoupling capacitor groups 104 on the impedance-frequency characteristics of the circuitry can be analyzed.

The initial version of the model 157 of the circuitry includes an initial estimated number of decoupling capacitors in each decoupling capacitor group 104. This initial number is provided so that some decoupling capacitance is present in the model 157 in order for analysis to be performed. The analysis may determine that additional decoupling capacitance may be desired for the circuitry.

The analysis module 156 chooses a single, particular power supply 106 for analysis. Once the model 157 is provided and the power supply 106 for analysis is chosen, the simulation module 155 performs a frequency-inductance sweep (FZ sweep) to determine the impedance value of the circuitry across a range of frequencies. The range of frequencies may constitute a range beginning with a highest frequency that the power supplies 106 are capable of handling up to a highest frequency that the decoupling capacitors are capable of handling, to provide impedance data for a range of frequencies over which the decoupling capacitors would operate. Techniques for performing such simulations, given a model of circuitry, are generally known to those of skill in the art.

The analysis module 156 chooses a total current utilization for the particular power supply 106 that is being analyzed. This total current utilization describes the total amount of current provided by the particular power supply being analyzed when the circuitry is operated at "maximum" or "highest" current utilization. The total current utilization may be chosen based on an expected current utilization of the circuit represented by the model 157, or may be chosen based on other factors. The analysis module 156 also chooses a step current, which represents the change in an amount of current demanded by the circuit in an oscillating fashion, as described above. In other words, as described above, a particular power supply 106 undergoes changes in the amount of current drawn from that power supply, where those changes occur with a particular frequency. The amount of change in current demanded is the step current. This step current may be already known or may be determined in any manner known to those of skill in the art.

Analysis module 156 also determines a target impedance value for the model 157 analyzed. The target impedance value represents a maximum impedance prescribed for the circuit at any frequency within the frequency range of analysis. Analysis module 156 may determine the target impedance as follows. First, analysis module 156 determines a maximum voltage drop that is tolerable for the particular power supply 106 chosen for analysis. Such a maximum voltage drop (also referred to herein as a "target voltage drop") may be, for example, 3% of the difference between high and low voltage of the power supply. Then, using Ohm's law (V=IR, or V=IZ, where Z is impedance, V is voltage, I is current, and R is resistance), the target impedance is determined, with V of Ohm's law set to the maximum voltage drop and I equal to the step current. This can be expressed in the following manner:

target impedance=maximum voltage drop/step current

In some situations, the target impedance may be a fraction of the above-described value, so that a "buffer" is provided below the impedance level specifically dictated by the maximum voltage drop and step current. This fraction may be referred to as a "buffer constant." Thus, the target impedance may be calculated instead as follows:

target impedance=buffer constant*maximum voltage drop/step current

With the target impedance determined, analysis module 156 examines the results from the FZ sweep simulation to determine whether all impedances within the frequency range are below the target impedance. If all impedances within the frequency range are below the target impedance, then the analysis module 156 determines that the current number of decoupling capacitors for each decoupling capacitor group 104 for the power supply 106 being analyzed is the "final" number of decoupling capacitors. If all impedances within the frequency range are not below the target value—in other words, some impedances are above the target value, then analysis module 156 determines that one or more decoupling capacitors should be added. Since, as described above, decoupling capacitors with different capacitance values are effective at different frequency ranges, analysis module 156 may add capacitors to the decoupling capacitor groups 104 based on which frequency range is above the threshold. Specifically, analysis module 156 may add decoupling capacitors having a capacitance value that corresponds to the frequency range that is above the threshold.

Analysis module 156 may choose a number of capacitors to add in a number of different ways. For example, analysis module 156 may add only one capacitor of a particular capacitance value. In another example, analysis module 156 may vary the number of capacitors added based on how far above the threshold the impedance is. For larger amounts above the threshold, analysis module 156 would add a larger number of capacitors and for smaller amounts above the threshold, analysis module 156 would add a smaller number of capacitors.

After adding capacitors to the model 157, analysis module 156 causes simulation module 155 to perform another FZ sweep, with the altered model having the new number of decoupling capacitors. Analysis module 156 analyzes the results of this newly performed FZ sweep and repeats the other steps described above, adding decoupling capacitors if appropriate.

Once an appropriate number of capacitors for each decoupling capacitor group 104 is found for a particular power supply 106, analysis module 156 calculates a decoupling constant for each decoupling capacitor group 104 associated with the power supply 106 with the following expression, where, again, the step current is the change between low and high current drawn for the power supply 106 and the number of capacitors is the "final" number of decoupling capacitors included for a particular decoupling capacitor group 104:

decoupling constant=step current/number of capacitors

This decoupling constant can be used to determine a number of decoupling capacitors appropriate for the same circuit upon which the analysis described above is performed, but for which a different amount of current is drawn. In other words, when the circuit is operated with a higher or lower current, a different number of decoupling capacitors, appropriate for that particular current level, can be determined. More specifically, for any particular decoupling capacitor group 104, step current, and decoupling constant, the number of capacitors appropriate for that decoupling capacitor group 104 can be found as follows:

number of capacitors=step current/decoupling constant

Thus, the decoupling constants allow analysis module 156, to determine how many of a particular decoupling capacitor is appropriate for a particular circuit, given a particular step current.

After determining a number of capacitors for a particular circuit model and a decoupling constant, the analysis module 156 may generate and output a power profile for the circuit model. This power profile includes the number of capacitors and the decoupling constant and may also include other power information about the circuit model, such as total current drawn by the circuit, total power usage, the step current described above, as well as other data.

Figure 2:
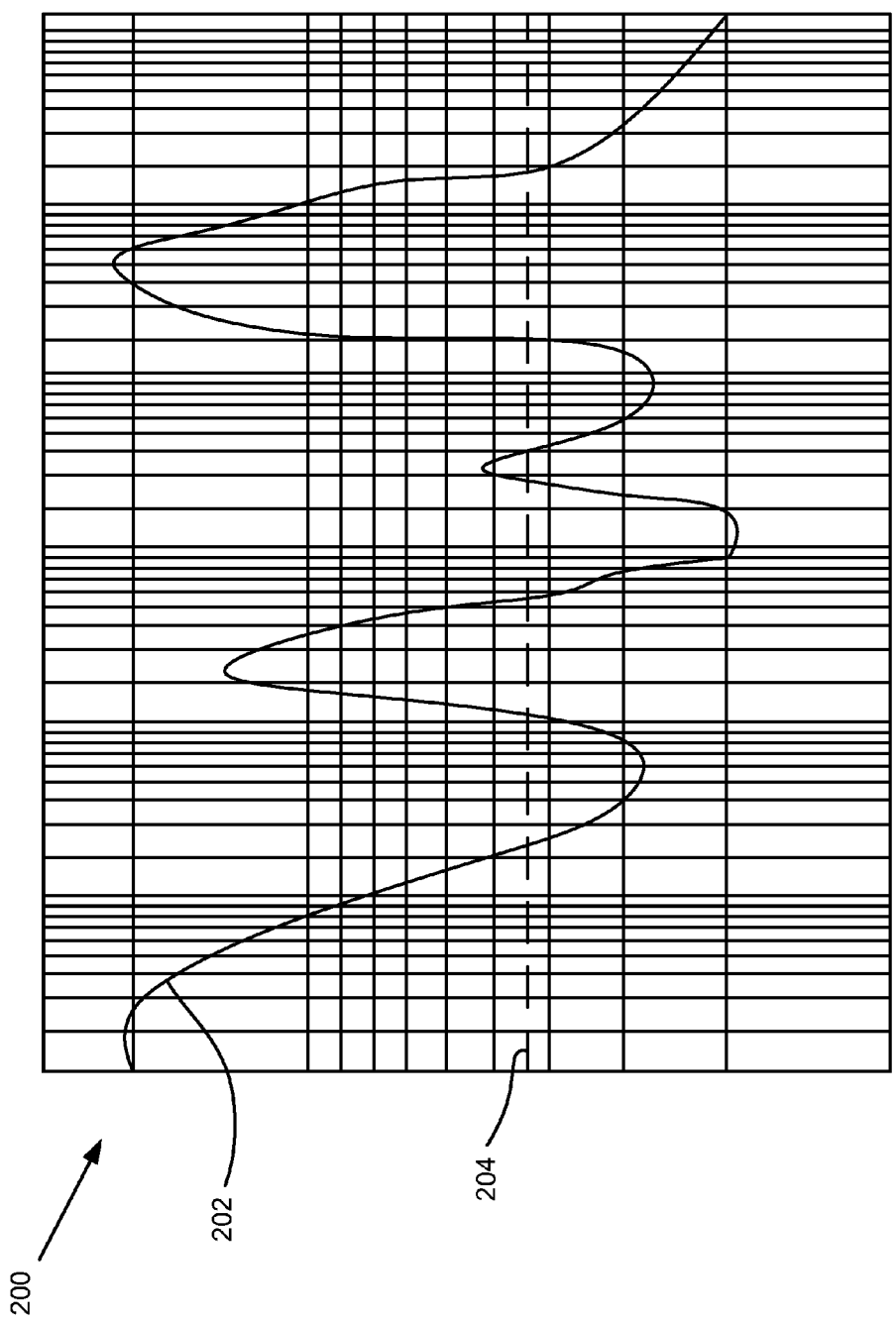
FIG. 2 is a graph illustrating frequency on the x-axis versus impedance on the y-axis.

FIG. 2 is a graph illustrating frequency on the x-axis versus impedance on the y-axis. Both axes are on a logarithmic scale. As shown, the graph line 202 varies in impedance along the range of frequencies shown. This graph line 202 represents the results from a particular FZ sweep for a particular circuit. As can be seen, for several frequency ranges, the impedance is above a threshold, represented by threshold line 204. For other frequency ranges, the impedance is below the threshold. Nevertheless, because impedance is above the threshold for at least some frequencies, an FZ sweep that resulted in the data illustrated in FIG. 2 would indicate that more decoupling capacitors would be added to the corresponding circuit.

Figure 3:
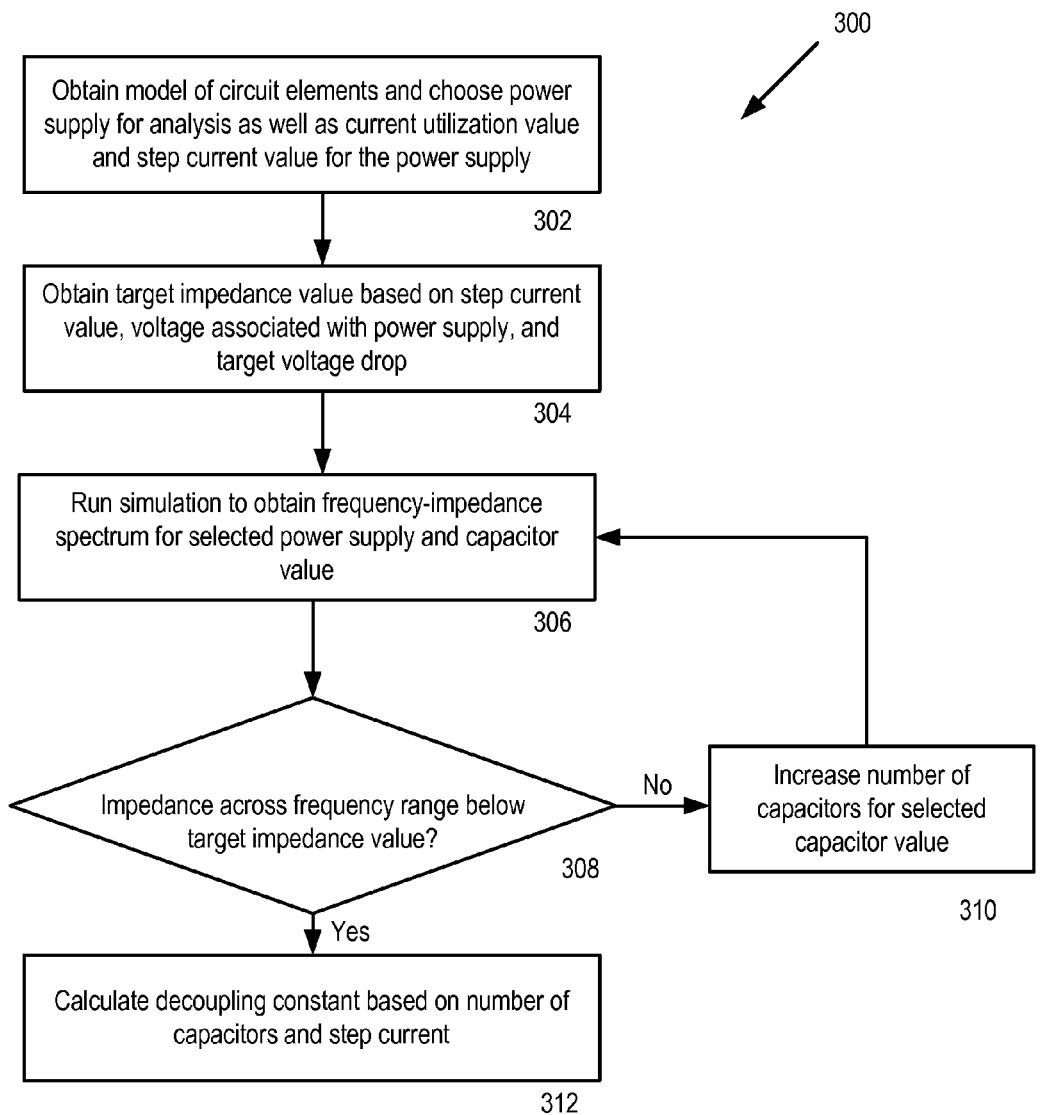
FIG. 3 is a flow diagram of method steps for analyzing a circuit to determine a number of decoupling capacitors to use within the circuit.

FIG. 3 is a flow diagram of method steps for analyzing a circuit to determine a number of decoupling capacitors to use within the circuit. Although described in a particular order, those of skill in the art will recognize that the actual order of steps may vary and that a wide variety of step orders may be used. Additionally, although described in conjunction with the system of FIG. 1B, those of skill in the art will realize that any entity that performs the steps would be within the scope of the present disclosure.

As shown, a method 300 begins at step 302 in which the simulation module 155 obtains a model of circuit elements for analysis, chooses a power supply 106 for analysis, and chooses a current utilization and step current value for the power supply. The model includes one or more power supplies 106 which are each generally set to operate at a particular voltage. The voltage of any particular power supply 106 may be the same or different as the voltage of any other power supply 106. The current utilization represents the total current provided by the selected power supply 106 and may be equal or substantially equal to the "full current" value described above. The step current value represents the difference between the full current value and the quiescent current value.

The analysis module 155 chooses the current utilization based on an expected "full" current draw for the circuitry being analyzed. Similarly, the analysis module 155 chooses the step current based on an expected difference in current utilization by the circuitry being analyzed. The chosen power supply 106 has a pre-known set of associated decoupling capacitors, with associated capacitance values, for performing the above described decoupling function. For example, a particular chosen power supply 106 may have a pre-known decoupling capacitor with a first capacitance value and a pre-known decoupling capacitor with a second capacitance value, meaning that it is already known that to perform the decoupling function discussed above, decoupling capacitors having the first capacitance value and decoupling capacitors having the second capacitance value should be used. As described above, the method 300 is a method for determining the numbers of decoupling capacitors of these different capacitance values that should be included in order to perform this decoupling function.

At step 304, analysis module 155 obtains a target impedance value based on the step current value, the voltage associated with the selected power supply 106, and the target voltage drop for that power supply. The target voltage drop can be characterized as a substantially maximum voltage drop that would occur when changing from the quiescent current to the full current or vice versa. The target impedance value is calculated based on Ohm's law as $Z=V/I$, where V is the target voltage drop and I is the step current. With such a target impedance value, set as the highest allowable impedance at all frequencies of interest (i.e., the frequencies in the range scanned in the FZ sweep), the highest voltage drop that will occur will be the target voltage drop, since voltage has a direct relationship with impedance.

At step 306, simulation module 155 performs a simulation on the circuitry 100 to determine frequency-impedance characteristics. More specifically, simulation module 155 runs a frequency sweep simulation over a range of frequencies in order to determine a single impedance value for the circuitry 100 at each frequency in that range. The impedance value is characterized as the impedance "experienced" over the circuitry 100, as a whole. As described above, the simulation may be performed using known circuit simulation techniques. The collection of frequencies and associated impedances may be referred to herein as the "FZ characteristics" of the circuitry 100, for the particular power supply and step current value being analyzed.

Once the FZ characteristics are determined, analysis module 156 determines whether the impedance at each frequency examined is below the target impedance value. If the impedance is above the target impedance for at least one frequency examined, then the method proceeds to step 310. If the impedance is below the target impedance value at each frequency examined, then the method proceeds to step 312, where analysis module 156 calculates a decoupling constant for each capacitance value associated with the power supply 106 that is analyzed.

At step 310, analysis module 156 adds capacitors to the model analyzed by simulation module 155. Analysis module 156 can determine the number of decoupling capacitors to add in a number of different ways. In one example, each time the analysis module 156 adds decoupling capacitors, the analysis module 156 adds the same number of decoupling capacitors 156. In another example, the closer the analysis module 156 is to the "goal" of all impedances below the target impedance value, the fewer decoupling capacitors the analysis module 156 adds to the model.

If the power supply 106 being analyzed is associated with more than one decoupling capacitor group 104, then analysis module 156 adds capacitors to the model based on which frequencies correspond to an impedance that is above the target impedance value. More specifically, because a particular decoupling capacitor group 104 generally services frequency ranges based on the capacitance value of that decoupling capacitor group 104, analysis module 156 adds to the model decoupling capacitors having a capacitance value that corresponds to the frequency for which impedance is above the target threshold. In one example, a particular model has a first set of capacitors each having a capacitance value of 680 μF (microfarads) which services frequencies between 200 kHz and 1 MHz and a second set of capacitors each having a capacitance value of 4.7 µF which services frequencies between 1 MHz and 10 MHz. In this example, if the impedance is above the target impedance for 300 kHz, then analysis module 156 adds 680 µF capacitors to the model. Of course, if impedance is above the target impedance for different frequency ranges corresponding to different capacitance values, then analysis module 156 adds capacitors for both capacitance values.

After step 310, the method returns to step 306 in order to run the simulation again to determine whether the new number of decoupling capacitors causes the impedance to be below the impedance threshold for substantially all frequencies in the frequency range in question.

At step 312, analysis module 156 calculates a decoupling constant for each capacitance value associated with the power supply 106 that is analyzed. More specifically, for each capacitance value, analysis module 156 calculates a decoupling constant as step current/number of capacitors.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A method for determining a first decoupling constant for circuitry, the method comprising:
   determining a target impedance value and a first step current value for the circuitry;
   iteratively simulating a model of the circuitry in a computing environment while adjusting a first number of first decoupling capacitors until impedance across a swept range of frequencies is below the target impedance value to obtain a first final number of first decoupling capacitors, wherein the swept range of frequencies comprises different frequencies at which current demands of the circuitry change between a high current value and a low current value;
   calculating a first decoupling constant based on the first step current value and the first final number of first decoupling capacitors; and
   fabricating the circuitry in an integrated circuit based on the first decoupling constant.

2. The method of claim 1, further comprising:
   determining the target impedance value by dividing a target voltage drop by the first step current value, wherein the first step current value is a difference in current demand of the circuitry between the high current value and the low current value.

3. The method of claim 1, further comprising:
   calculating a second final number of first decoupling capacitors based on a second step current value by dividing the second step current value by the first decoupling constant.

4. The method of claim 1, wherein:
   iteratively simulating the model further comprises adjusting a second number of second decoupling capacitors in conjunction with adjusting the first number of first decoupling capacitors until the impedance across the swept range of frequencies is below the target impedance value to obtain a third final number of second decoupling capacitors; and
   a first capacitance value associated with the first decoupling capacitors is different than a second capacitance value associated with the second decoupling capacitors.

5. The method of claim 1, wherein:
   calculating the first decoupling constant comprises dividing the first step current value by the first final number of first decoupling capacitors.

6. The method of claim 1, wherein:
   the first step current comprises a difference between a full current utilization associated with a power supply and a quiescent current utilization associated with the power supply.

7. The method of claim 6, wherein:
   the frequencies comprise frequencies at which the circuitry changes current demand from the power supply between the full current utilization and the quiescent current utilization.

8. The method of claim 1, further comprising:
   obtaining the model of the circuitry, the model including the first decoupling capacitors coupled in parallel with a power supply powering circuit elements.

9. The method of claim 1, further comprising:
   outputting a power profile that includes the first final number of first decoupling capacitors and the first decoupling constant.

10. A computer system for determining a first decoupling constant for circuitry, the computer system comprising:
a processor; and
a memory storing instructions that, when executed by the processor, cause the processor to perform a method, the method comprising:
determining a target impedance value and a first step current value for the circuitry;
iteratively simulating a model of the circuitry while adjusting a first number of first decoupling capacitors until impedance across a swept range of frequencies is below the target impedance value to obtain a first final number of first decoupling capacitors, wherein the swept range of frequencies comprises different frequency values at which current demands of the circuitry change between a high current value and a low current value;
calculating a first decoupling constant based on the first step current value and the first final number of first decoupling capacitors; and
controlling the fabrication of the circuitry in an integrated circuit based on the first decoupling constant.

11. The computer system of claim 10, wherein the method further comprises:
determining the target impedance value by dividing a target voltage drop by the first step current value, wherein the first step current value is a difference in current demand of the circuitry between the high current value and the low current value.

12. The computer system of claim 10, wherein the method further comprises:
calculating a second final number of first decoupling capacitors based on a second step current value by dividing the second step current value by the first decoupling constant.

13. The computer system of claim 10, wherein:
iteratively simulating the model further comprises adjusting a second number of second decoupling capacitors in conjunction with adjusting the first number of first decoupling capacitors until the impedance across the swept range of frequencies is below the target impedance value to obtain a third final number of second decoupling capacitors; and
a first capacitance value associated with the first decoupling capacitors is different than a second capacitance value associated with the second decoupling capacitors.

14. The computer system of claim 10, wherein: calculating the first decoupling constant comprises dividing the first step current value by the first final number of first decoupling capacitors.

15. The computer system of claim 10, wherein:
the first step current comprises a difference between a full current utilization associated with a power supply and a quiescent current utilization associated with the power supply.

16. The computer system of claim 15, wherein: the frequencies comprise frequencies at which the circuitry changes current demand from the power supply between the full current utilization and the quiescent current utilization.

17. The computer system of claim 10, wherein the method further comprises:
obtaining the model of the circuitry, the model including the first decoupling capacitors coupled in parallel with a power supply powering circuit elements.

18. The computer system of claim 10, wherein the method further comprises:
outputting a power profile that includes the first final number of first decoupling capacitors and the first decoupling constant.

19. A non-transitory computer-readable medium storing instructions that, when executed by a processor, cause the processor to perform a method for determining a first decoupling constant for circuitry, the method comprising:
determining a target impedance value and a first step current value for the circuitry;
iteratively simulating a model of the circuitry while adjusting a first number of first decoupling capacitors until impedance across a swept range of frequencies is below the target impedance value to obtain a first final number of first decoupling capacitors, wherein the swept range of frequencies comprises different frequency values at which current demands of the circuitry change between a high current value and a low current value;
calculating a first decoupling constant based on the first step current value and the first final number of first decoupling capacitors; and
controlling the fabrication of the circuitry in an integrated circuit based on the first decoupling constant.

20. The computer-readable medium of claim 19, wherein the method further comprises:
determining the target impedance value by dividing a target voltage drop by the first step current value, wherein the first step current value is a difference in current demand of the circuitry between the high current value and the low current value.

* * * * *